United States Patent [19]
Racino et al.

[11] Patent Number: 5,559,981
[45] Date of Patent: Sep. 24, 1996

[54] PSEUDO STATIC MASK OPTION REGISTER AND METHOD THEREFOR

[75] Inventors: Gregory A. Racino, Austin, Tex.; Jeffrey R. Jorvig, Chandler, Ariz.

[73] Assignee: Motorola, Inc., Schaumburg, Ill.

[21] Appl. No.: 194,900

[22] Filed: Feb. 14, 1994

[51] Int. Cl.$^6$ ............................................. G06F 12/00
[52] U.S. Cl. ........................ 395/430; 364/DIG. 1; 364/DIG. 2; 395/869; 365/222; 365/120; 365/189.05
[58] Field of Search ............................ 364/200 MS File, 364/900 MS File, 958.2, 252.5, 259.7; 365/120, 189.05, 280.08, 218, 222; 395/425, 650, 182.1, 735, 400, 430, 869

[56] References Cited

U.S. PATENT DOCUMENTS

| | | | |
|---|---|---|---|
| 4,247,919 | 1/1981 | White, Jr. et al. | 365/222 |
| 4,768,169 | 8/1988 | Perlegos | 365/200 |
| 4,783,764 | 11/1988 | Tsuchiya et al. | 365/185.21 |
| 5,046,180 | 9/1991 | Ueda et al. | 365/189.03 |
| 5,179,536 | 1/1993 | Kasa et al. | 365/200 |
| 5,262,342 | 11/1993 | Toyama et al. | 437/52 |
| 5,270,944 | 12/1993 | Kuroda et al. | 364/490 |
| 5,297,096 | 3/1994 | Terada et al. | 365/218 |
| 5,307,464 | 4/1994 | Akao et al. | 395/156 |
| 5,388,065 | 2/1995 | Yoneda | 365/49 |

FOREIGN PATENT DOCUMENTS 3010386A  1/1991  Japan .

*Primary Examiner*—Matthew M. Kim
*Attorney, Agent, or Firm*—Elizabeth A. Apperley

[57] ABSTRACT

A pseudo-static mask option register (50) combines features of both a continuous refresh design and a static latched mask option register design. Pseudo-static mask option register (50) removes a mask option function from a main user memory (48) such that the functionality of the mask option register (50) is not limited by a plurality of electrical characteristics of the main use memory (48). When using the pseudo-static mask option register (50), a memory state of each memory bit (64, 66, 68) is read at any time. Additionally, a portion of the memory bits (64, 66, 68) is periodically refreshed such that pseudo-static mask option register (50) maintains an integrity of a value stored therein while minimizing power consumption. Pseudo-static mask option register (50) also has a non-volatile output state to allow emulation of mask options which are vulnerable to electrical disturbances.

25 Claims, 4 Drawing Sheets

PSEUDO STATIC MASK OPTION REGISTER AND METHOD THEREFOR

FIELD OF THE INVENTION

This invention relates generally to a mask option register, and more particularly to a mask option register in a data processor.

BACKGROUND OF THE INVENTION

In many single chip microcontrollers (MCU's), a manufacturer will offer a mask option feature. Generally, a mask option is an option a user chooses when ordering mask read only memory (ROM) devices which customizes the functionality of the mask ROM. For example, a mask option could be used to choose whether or not an on-chip peripheral is active, the function of input/output (I/O) pins, and even some electrical characteristics of the device.

Mask ROM devices typically use a mask layer during a fabrication step to include the user's desired software and data options for the MCU device. When a mask layer is used, the software and data options are considered permanent and may not be modified after the fabrication process. When the mask option is implemented internally within the MCU device, one or more signal lines will be required to be a logic one or a logic zero value. These signal lines will then be used to configure the option based on circuitry internal to the MCU device.

A mask option register (MOR) is a circuit which allows an external user to emulate the mask option feature of a MCU device having a ROM in a MCU device having either an electrically programmable read only memory (EPROM) or an electrically erasable programmable read only memory (EEPROM). The EPROM and EEPROM are non-volatile memories which may be programmed to have the software and data options desired in a MCU device after fabrication. The non-volatile memory in a MCU device stores the option information which may be read and then used to force the option signals to an appropriate logic state.

A challenge in the design of the MOR for an EPROM-based MCU device is the desire to have the mask option signals operate with the same electrical and functional characteristics as the masked ROM-based MCU device. The same electrical and functional characteristics are desired because the EPROM/EEPROM-based MCU device generally serves as an emulation device for the ROM-based version. Additionally, it is not desirable to stock several versions of an EPROM or EEPROM-based MCU device with all possible mask option variations. In most implementations, several devices would be required to implement every possible option configuration.

Currently, a MOR is typically implemented using either a static latched design or a continuous refresh design. In the static latched design, mask option data is stored in a portion of an EPROM in a MCU device. A remaining portion of the EPROM is used to store the software and data required to operate the MCU device. When the MCU receives a reset (due to powering up or the system forcing a reset onto the microcontroller), the mask option information is read from the EPROM and stored in static latches which will remember the state of the data.

In the static latched design, the MOR is totally dependent on the operational parameters of the EPROM block. Therefore, the mask option signals are only valid within the operating voltages, frequencies, and temperatures at which the EPROM block may perform. Second, the state of the mask option signals is not valid until the assertion of the reset signal has terminated. Therefore, there are some types of mask options which may not be implemented in the static latched MOR design because the mask options must be valid during a reset sequence. Thirdly, the state of the mask options is held in latches which may become corrupt under adverse conditions with no possibility of recovery.

SUMMARY OF THE INVENTION

The previously mentioned needs are fulfilled with the present invention. Accordingly, there is provided, data processing system. The data processing system includes an interface circuit for providing a mask option program value. The data processing system includes a system clock circuit for generating a system clock signal. The data processing system also includes a first peripheral device for executing a first predetermined data processing function in response to a first enable signal and a main memory for storing a plurality of main memory values. A mask option register has a first input connected to the interface circuit for receiving the mask option program value, a second input connected to the system clock circuit for receiving the system clock signal, and an output for providing the first enable signal. The mask option register includes a logic circuit for generating a refresh signal in response to the system clock signal. The mask option register also includes a plurality of memory bits for collectively storing the mask option program value. Each of the plurality of memory bits provides a bit of the mask option program value. A plurality of sense amplifier circuits are connected to the plurality of memory bits for sensing a logic value of the mask option program value collectively provided by the plurality of memory bits. A plurality of static latches collectively store the mask option program value. The plurality of static latches are periodically refreshed in response to the refresh signal. A first one of the plurality of static latches provides the first enable signal.

In a second embodiment of the invention, a method is provided for executing a mask option operation. The mask option operation includes the steps of receiving a mask option program value and receiving a system clock signal. The system clock signal is provided to a refresh circuit. The refresh circuit generates a refresh clock signal in response to the system clock signal. The mask option program value is stored in a plurality of memory bits. Each of the plurality of memory bits stores a bit of the mask option program value. Each of the plurality of memory bits is provided to a plurality of sense amplifiers. Each of the plurality of sense amplifiers senses a logic value of a respective one of the plurality of memory bits. A plurality of static latches are coupled to the plurality of sense amplifiers. The plurality of static latches are enabled to latch a plurality of logic values corresponding to the plurality of memory bits. The plurality of static latches are periodically refreshed to maintain the plurality of logic values stored therein in response to the refresh signal.

These and other features, and advantages, will be more clearly understood from the following detailed description taken in conjunction with the accompanying drawings. It is important to note the drawings are not intended to represent the only form of the invention.

DETAILED DESCRIPTION OF A PREFERRED EMBODIMENT

The present invention provides a pseudo-static mask option register (MOR) which implements a mask option function which combines all of the advantages of a static latched mask option register design and a continuous refresh mask option register design. The pseudo-static MOR disclosed in the present embodiment of the invention is implemented using a same non-volatile memory technology as that of a main user memory. Assume in the following discussion that the main memory is an EPROM. It should be noted that the main memory could also be implemented as an EEPROM or another non-volatile memory.

The pseudo-static MOR implemented in the present invention has significantly improved operation of both the static latched mask option registers and the continuous refresh mask option registers implemented in prior art systems. The embodiment of the invention disclosed herein will subsequently be discussed in more detail. However, each of the static latch mask option register and continuous refresh mask option register prior art implementations will also be discussed in more detail.

During a following description of the implementation of the invention, the terms "assert" and "negate," and various grammatical forms thereof, are used to avoid confusion when dealing with a mixture of "active high" and "active low" logic signals. "Assert" is used to refer to the rendering of a logic signal or register bit into its active, or logically true, state. "Negate" is used to refer to the rendering of a logic signal or register bit into its inactive, or logically false state. It should also be noted that a "$" preceding a value indicates that the value is hexadecimal.

Description of Connectivity

Figure 1:
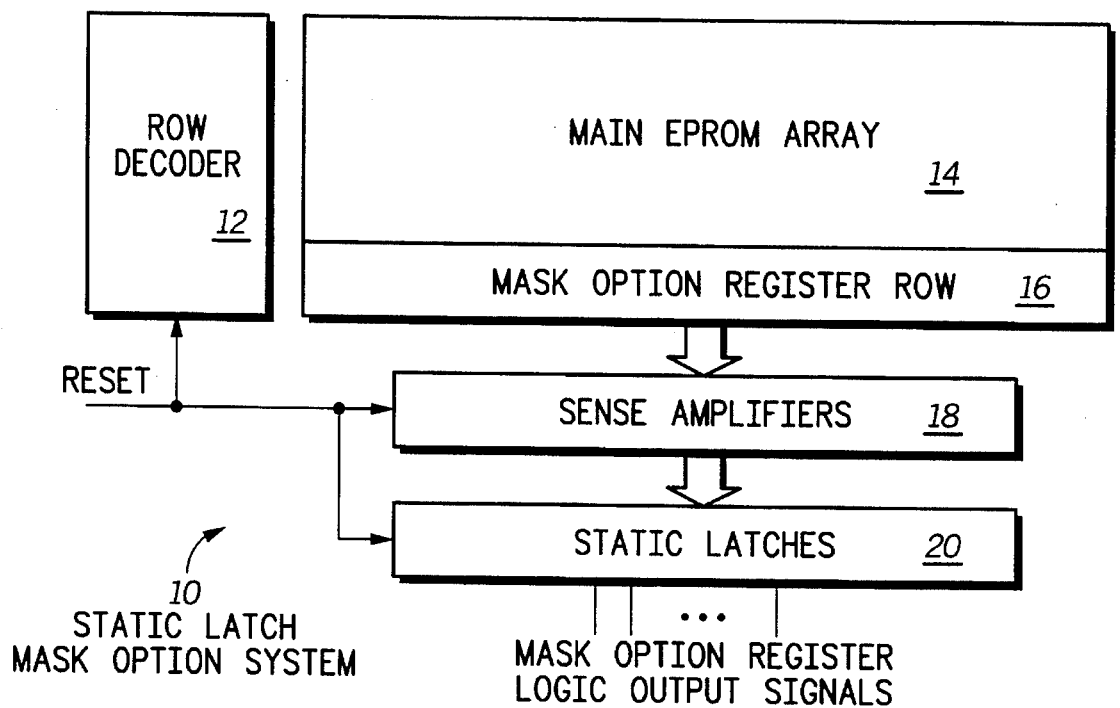
FIG. 1 illustrates in partial block diagram form a mask option register implemented using a static latched design.

FIG. 1 illustrates a prior art static latch mask option system 10. Static latch mask option system 10 includes a row decoder 12, a main EPROM array 14, a MOR (mask option register row) 16, a plurality of sense amplifiers 18, and a plurality of static latches 20. A Reset signal is provided to each of row decoder 12, the plurality of sense amplifiers 18, and the plurality of static latches 20.

Figure 3:
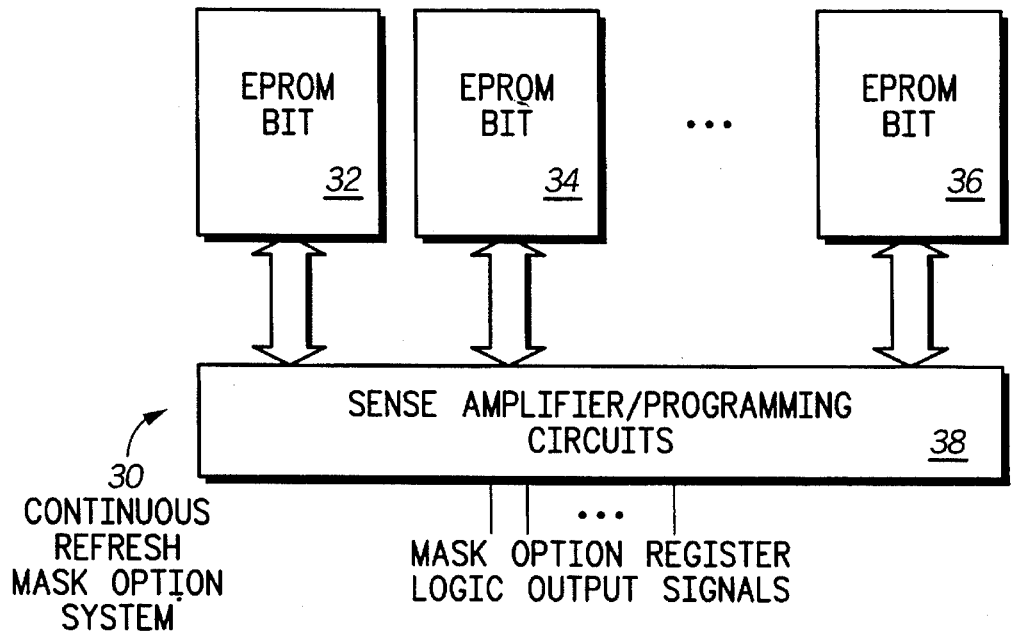
FIG. 3 illustrates in block diagram form a mask option register implemented using a continuous refresh design.

FIG. 3 illustrates a prior art continuous refresh mask option system 30. Continuous refresh mask option system 30 includes a plurality of EPROM bits 32, 34, and 36. Continuous refresh mask option system 30 also includes a plurality of sense amplifier/programming circuits 38.

Figure 5:
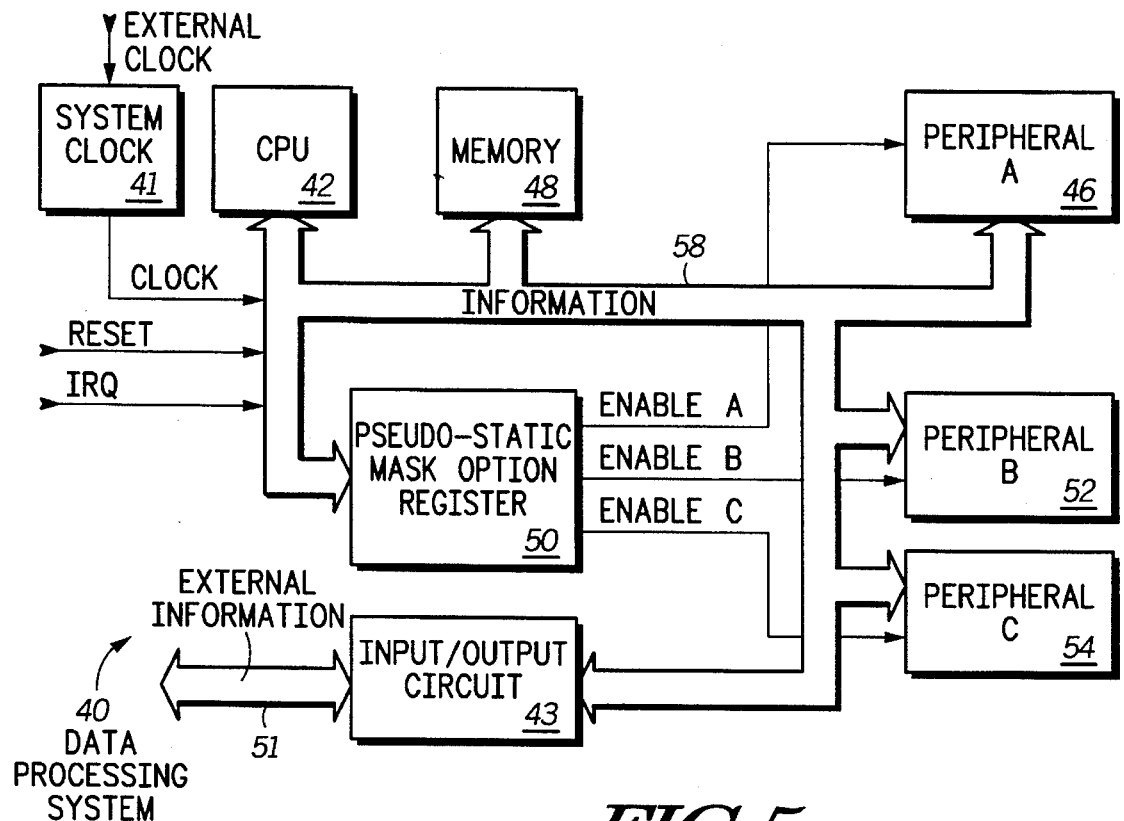
FIG. 5 illustrates in block diagram form a data processing system having a pseudo-static mask option register.

FIG. 5 illustrates a data processing system 40 which implements a pseudo-static mask option function. Data processing system 40 includes a system clock generation circuit 41, a central processing unit (CPU) 42, an input/output circuit 43, a memory 48, a peripheral A 46, a pseudo-static mask option register 50, a peripheral B 52, and a peripheral C 54. An Information bus 58 bidirectionally couples each of CPU 42, input/output circuit 43, memory 48, peripheral A 46, pseudo-static mask option register 50, peripheral B 52, and peripheral C 54. Pseudo-static mask option register is coupled to peripheral A 46 to provide an Enable A signal. Pseudo-static mask option register is also coupled to each of peripheral B 52 and peripheral C 54 to respectively provide an Enable B and an Enable C signal. System clock generation circuit 41 receives an External Clock signal and provides a clock signal via Information bus 58. External integrated circuit pins provide a Reset signal and an IRQ signal to data processing system 40 via Information bus 58. Furthermore, input/output circuit 43 is coupled to external devices (not shown) via an External Information bus 51.

Figure 6:
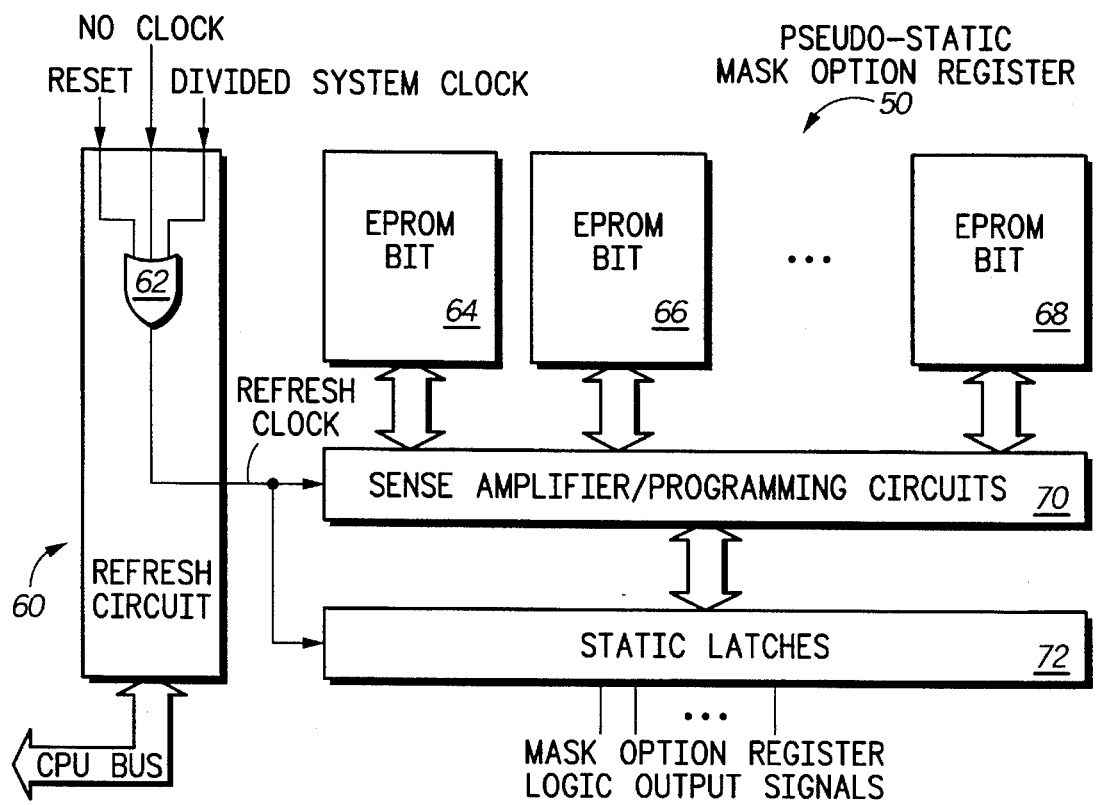
FIG. 6 illustrates in partial block diagram form the pseudo-static mask option register of FIG. 5.

FIG. 6 illustrates pseudo-static mask option register 50 in more detail. Pseudo-static mask option register 50 includes a refresh circuit 60, a plurality of EPROM bits 64, 66, and 68, a plurality of sense amplifier/programming circuits 70, and a plurality of static latches 72. Refresh circuit 60 includes an OR gate 62.

A Reset signal, a No Clock signal, and a Divided System Clock signal are provided to respective inputs of OR gate, 62. Each of the Reset signal, the No Clock sisal, and the Divided System Clock signal is provided to pseudo-static mask option register 50 via Information bus 58. An output of OR gate 62 is a signal labeled "Refresh Clock." The Refresh Clock sisal is provided to both the plurality of sense amplifier/programming circuits 70 and the plurality of static latches 72. As well, although not shown in FIG. 6 for clarity, Information bus 48 also provides data an control information to each of the plurality of EPROM bits 64, 66, and 68, the plurality of sense amplifier/programming circuits 70, and the plurality of static latches 72.

Figure 8:
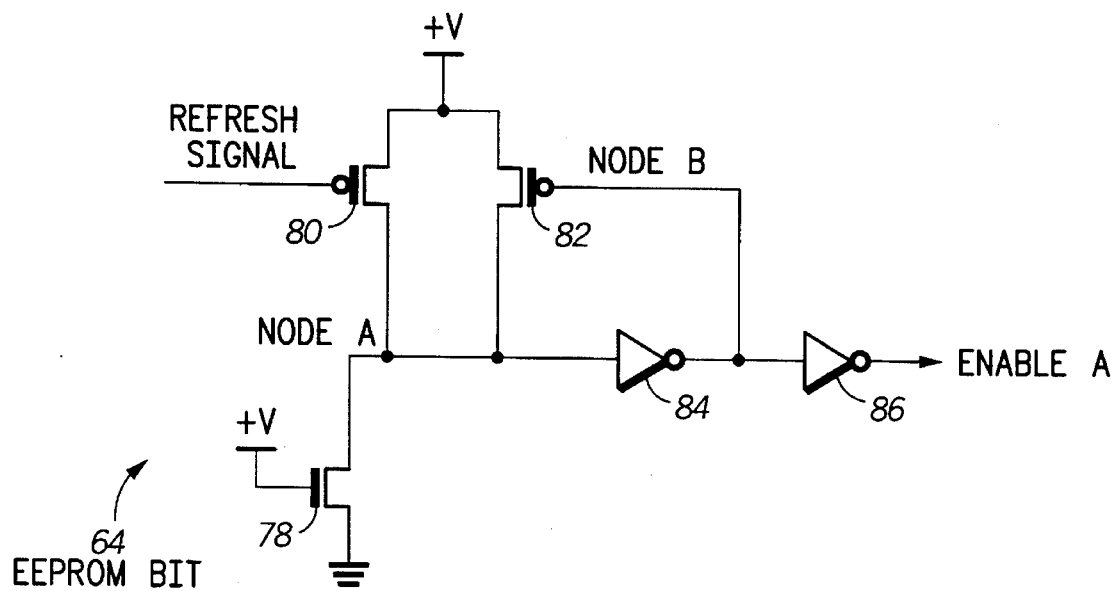
FIG. 8 illustrates in partial circuit diagram form an EPROM cell configuration for use in the pseudo-static mask option register of FIG. 6.

FIG. 8 illustrates EPROM bit 64 when in a non-volatile state. EPROM bit 64 includes a transistor 78, a transistors 80, a transistor 82, an inverter 84, and an inverter 86. A first terminal of transistor 78 is coupled to a reference voltage value and a second terminal of transistor 78 is coupled to receive a nominal voltage value. A third terminal of transistor 78 is labeled "Node A" for purposes of the later discussion. A first terminal of transistor 80 is coupled to the third terminal of transistor 78. A second terminal of transistor 80 is coupled to refresh circuit 60 of FIG. 6 to receive the Refresh Clock signal. A third terminal of transistor 80 and a first terminal of transistor 82 are both coupled to receive the nominal voltage value. A second terminal of transistor 82 is referred to as "Node B" for purposes of later discussion. A third terminal of transistor 82 is coupled to Node A and to an input of inverter 84. An output of inverter 84 Is coupled to an input of inverter 86 and to Node B. An output of inverter 86 provides a Mask Option Register output signal which corresponds to EPROM bit 64. It should be noted that each of EPROM bits 66 and 68 have similar non-volatile memory state configurations.

Prior Art Implementations

Static Latched Design

FIG. 1 is a block diagram of a static latch implementation for a mask option register system 10. In the implementation illustrated in FIG. 10, a plurality of mask option data values are stored in EPROM 14 together with a remaining portion of the software/data required for operation of mask option register system 10 and remaining portions of a data processing system (not shown herein).

When system 10 receives an asserted Reset signal, mask option information stored in mask option row 16 is read and stored in the plurality of static latches 20. The plurality of static latches 20 will "remember" the state of the mask option information. The Reset signal will be asserted when system 10 is powered up or when system 10 forces a reset.

Figure 2:
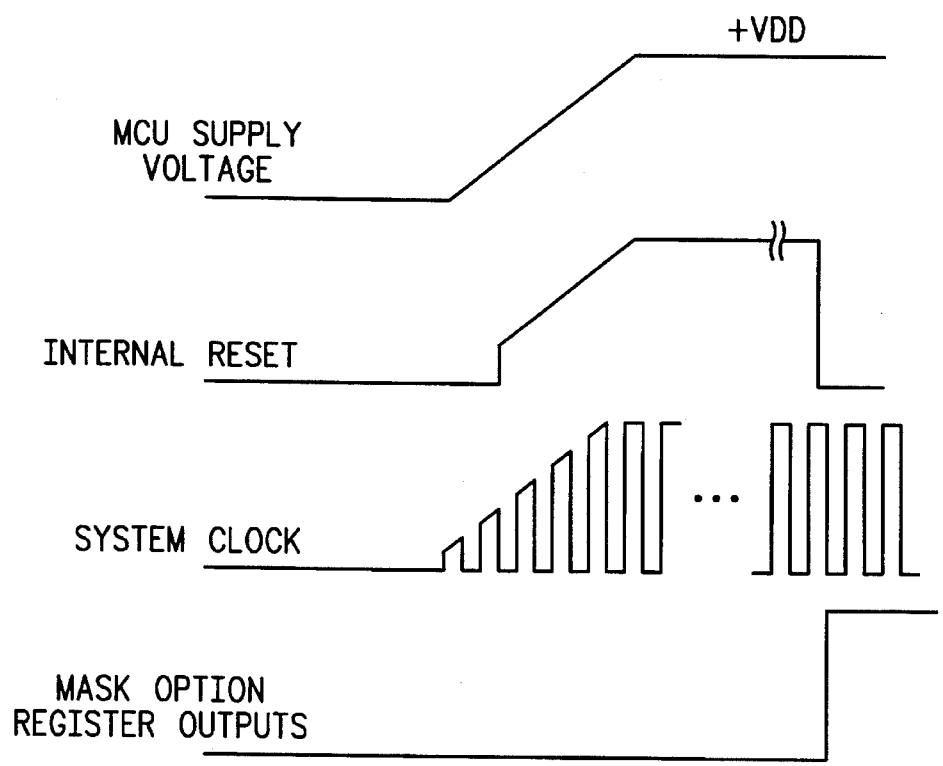
FIG. 2 illustrates in timing diagram form generation of a plurality of outputs of the static latched design of FIG. 1.

FIG. 2 illustrates the timing of the events as the data processing system in which the mask option register system 10 is powered up. As the power supply voltage begins to increase, a system clock begins to run and an internal reset is forced into a reset state by a power on reset circuit. The power up circuitry will hold the data processing system in a reset state until some period of time after the supply voltage has reached an acceptable voltage level. During the time the reset signal is asserted, the EPROM block is prepared to read mask option configuration data from mask option row 16 of EPROM array 14. As the reset signal is negated, the mask option configuration data from the mask option row of the EPROM array is latched in the plurality of static latches 20. The plurality of static latches output a mask option state via the plurality of Mask Option Register logic output signals.

The static latch mask option register design illustrated in FIG. 1 has several disadvantages. First, the mask option register implemented in system 10 is totally dependent on a plurality of operational parameters of EPROM, 14 and 16. Since the data for the mask options are in EPROM, accessing information is only possible within the voltage, frequency, and temperature limitations of the EPROM. Second, the state of the Mask Option Register logic output signals not valid until the Reset signal is negated. Third, a state of the mask option registers is stored in the plurality of static latches 20 which could be corrupted under adverse conditions with no possibility of recovery until a next system Reset signal is asserted.

Continuous Refresh Design

FIG. 3 illustrates a continuous refresh mask option register design 30 in which EPROM bits 32, 34, and 36 separate from an EPROM main memory are used to store mask configuration information. In continuous refresh mask option register design 30, dedicated EPROM bits 32, 34, and 36 store the mask configuration information without relying on the EPROM main memory (not shown herein). The EPROM bits are in a continuous read mode of operation when power is supplied to a data processor in which the EPROM bits are implemented. Mask option register logic data is immediately reflected at the outputs of each of the dedicated EPROM bits 32, 34, and 36. A plurality of sense amplifier/programming circuits 38 enable each of the EPROM bits to function as an NMOS transistor which transfers a voltage value if the EPROM bit is erased and does not transfer a voltage value if the EPROM bit is programmed. To sense a state of each EPROM bit, an EPROM bit has a weak pull-up device (not shown) to a positive voltage supply. The pull-up device is weak enough that the EPROM bit may easily pull an input voltage down to a ground voltage if the pull-up device is in a conducting state. If the EPROM bit is near a logic zero voltage level, then the EPROM bit must be in a conducting state. If the voltage provided to the EPROM bit is near the positive voltage supply, the EPROM bit does not conduct data.

Figure 4:
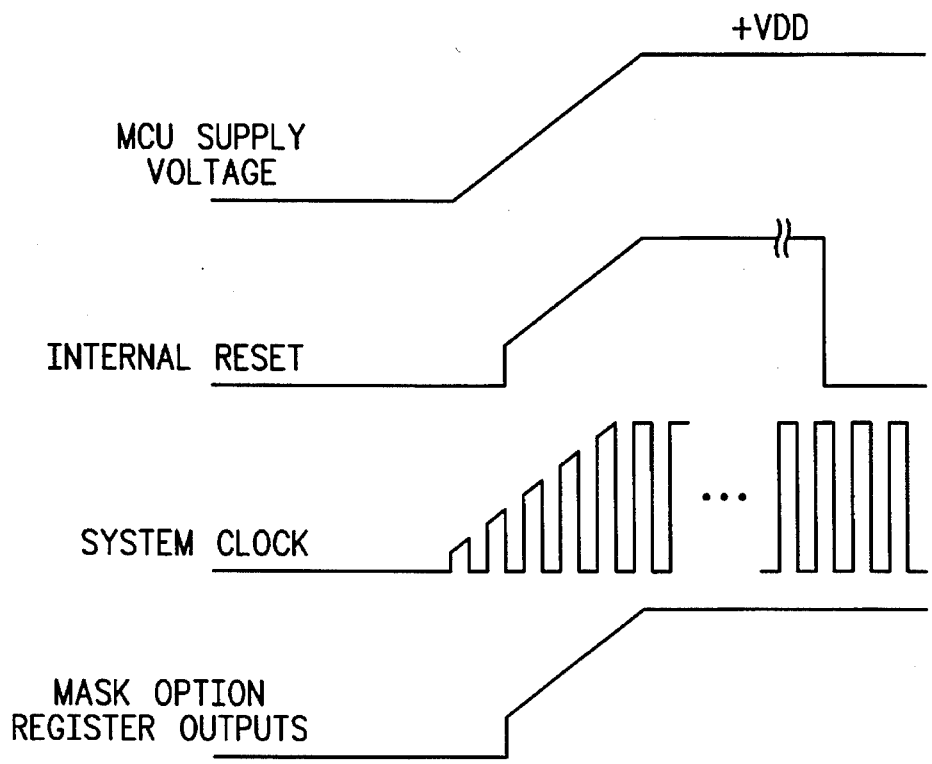
FIG. 4 illustrates in timing diagram for generation of a plurality of outputs of the continuous refresh design of FIG. 3.

FIG. 4 illustrates the timing of the events as the data processing system in which the mask option register system 30 is powered up. As is illustrated in FIG. 4, a plurality of mask option register logic output signals provided by the plurality of sense amplifier/programming circuits 38 become valid as soon as a MCU supply voltage increases in value. The plurality of mask option register logic output signals become valid as soon as the MCU supply voltage increases because the plurality of sense amplifier/programming circuits 38 sense continuously until the MCU supply voltage signal teaches a level that will allow the EPROM bit to function correctly. Neither a system clock signal nor a reset signal is needed for a state of one of the plurality of mask option register logic output signals to have a valid condition.

The continuous refresh design corrects several problems of the static latch design. The plurality of mask option register logic signals are implemented independently of the EPROM main memory such that a mask option register may operate under conditions where the EPROM main memory may not. The continuous refresh design allows a mask option status provided via the plurality of mask option register logic signals to be available more quickly and is valid during a reset of the data processing system in which the continuous refresh design is implemented. A final advantage of the continuous refresh design is that there is little susceptibility to electrical disturbances because there are no intermediate latches between each of the plurality of EPROM bits and the plurality of mask option register logic signals. A state of the EPROM bit is always reflected on a corresponding one of the plurality of mask option register logic signals.

However, the continuous refresh design has several disadvantages when compared with the static latched design discussed earlier. One disadvantage of the continuous refresh design is that a significant amount of power is required because each of the plurality of EPROM bits is being sensed continuously and current is flowing through each of the plurality of EPROM bits at all times after. The magnitude of the current flowing through each of the plurality of EPROM bits is dependent on a type of fabrication process used to manufacture the plurality of EPROM bits.

Another potential problem of the continuous refresh design is that the data retention time (how long the bit retains data) of the EPROM bit may be degraded because the EPROM bit will have a sensing bias voltage applied to it at all times. The data retention time is known to be dependent on the period of time the EPROM bit is biased.

The present invention discloses a mask option register which will correct several of the disadvantages of both prior art implementations. The present invention will implement a mask option register which is not dependent on an EPROM main memory. Furthermore, the present invention will provide mask option register logic output signals which are valid during a reset sequence, which are less susceptible to disturbances, and which will have low power consumption. Additionally, the present invention will not significantly reduce data retention associated with an EPROM. The present invention will subsequently be discussed in further detail.

General Summary of Invention

The present invention provides a pseudo-static mask option register (MOR) which implements a mask option function which combines all of the advantages of a static latched mask option register design and a continuous refresh mask option register design. The pseudo-static MOR disclosed in the present embodiment of the invention is implemented using the same non-volatile memory technology as that of a main user memory. Assume in the following discussion that the main memory is an EPROM. It should be noted that the main memory could also be implemented as an EEPROM or another non-volatile memory.

The pseudo-static MOR implemented in the present invention has significantly improved operation of both the static latched mask option registers and the continuous refresh mask option registers implemented in prior art systems. For example, the pseudo-static MOR circuitry is physically separated from a main user EPROM. The physical separation allows for greater flexibility and controllability of a plurality of mask option register signals provided as a result of a mask option function.

Furthermore, a plurality of EPROM bits are read (sensed) and stored into a static latch but the read and storing operation (referred to as "refreshing") is repeated on a periodic basis in order to ensure a pseudo-static MOR data value may not be permanently corrupted if an externally generated electrical disturbance occurs. Additionally, using a refreshed approached reduces power consumption since reading the EPROM cells is a current intensive operation. The amount of power savings will depend on a refresh rate.

Another advantage of the present invention is that one state of a plurality of pseudo-static MOR output signals provides for a "non-volatile MOR state." The non-volatile MOR state cannot be lost during an electrical disturbance. This feature provides the advantage of the continuously refreshed prior art approach. When it is determined that an important state of a pseudo-static MOR output signal cannot be in the incorrect state following an electrical disturbance for as long as it may require to refresh the bit or that a risk of having a periodic disturbance at a greater rate than the refresh rate exists, then the important pseudo-static MOR output state may be assigned to the non-volatile MOR state.

Additionally, the pseudo-static MOR output signals are valid as soon as the supply voltage is sufficient for CMOS logic and EPROM cells to operate. This is important for some peripheral devices included in the data processor which implements the pseudo-static MOR. The peripheral devices may include weak pull-up devices on interrupt input pins (to prevent false interrupts), on-chip voltage regulators which supply power to the data processor itself, and low voltage detection circuits which protect the data processor during a power-up procedure and a power-down procedure.

Although the invention was first created for use on a single chip microcontroller, the pseudo-static MOR may also be used in any digital integrated circuit which has non-volatile memory capability. The pseudo-static MOR which implements the improvements described above will subsequently be described in further detail.

The present embodiment of the invention is illustrated in FIG. 5. In data processing system 40, CPU 42 communicates data via an input/output circuit 43 or one of the plurality of peripheral devices 46, 52, and 54. Each of the plurality of peripheral devices 46, 52, and 54 provide for unique functionality of the data processing system. The plurality of peripheral devices 46, 52, and 54 may function as additional input/output circuits or may function to provide support for on-chip processing requirements. Such on-chip processing requirements may include timers, computer operating properly interrupts (COP's), security features, and voltage regulators. If a user so desires, the plurality of peripheral devices 46, 52, and 54 may be totally or partially enabled or disabled by an output of a mask option register. System clock generation circuit 41 generates a clock signal which is a timing basis for data processing activities. Each of CPU 42, memory 48, peripheral device A 46, peripheral device B 52, peripheral device C 54, pseudo-static mask option register (MOR) 50, and input/output circuit 43 use the clock signal to perform various data processing functions. Memory 48 may be implemented as an EPROM, EEPROM, or flash EPROM, but is not limited to such memory structures. Memory 48 is a main memory in which a user of data processing system 40 will place a software program. CPU 42 will subsequently be used to execute the software program to perform various data processing operations. Input/output circuit 43 communicates data between data processing system 40 and an external device. In general, pseudo-static mask option register 50 is used to enable and disable various data processing functions performed by data processing system 40. Information bus 58 is used to communicate data between the various circuits of data processing system 40. Information bus 58 communicates data and address information as well as clocks, system reset signals, and interrupt request signals.

During operation of data processing system, the Reset signal will be asserted. CPU 42 will subsequently begin executing a software program stored in main memory 48. The software program will retrieve data from either input/output circuit 43 or one of the plurality of peripheral devices 46, 52, and 54. Data provided by either input/output circuit 43 or one of the plurality of peripheral devices 46, 52, and 54 will be transferred to CPU 42 via Information bus 58. CPU 42 may manipulate the data or transfer the data to one of the plurality peripheral devices 46, 52, and 54. Once the data movement and data manipulation has taken place, CPU 42 may initiate another data transfer operation.

Description of Operation of the Pseudo-static MOR

FIG. 6 illustrates pseudo-static MOR 50 in greater detail. During operation of pseudo-static MOR 50, information stored in each of the plurality of EPROM bits is retrieved by sensing each of the plurality of EPROM bits via the plurality of sense amplifier/programming circuits 70. The information is then stored in the plurality of static latches 72. A logical state of each of the plurality of static latches 72 is then used to drive the plurality of mask option register output signals. Each of the plurality of static latches 72 is periodically reloaded ("refreshed") in response to the Refresh Clock signal to ensure a data stored therein can not be permanently lost. If the plurality of static latches 72 were not periodically refreshed, data stored in any one of the plurality of static latches 72 could be lost if a severe electrical disturbance occurred. As an example, an electrical disturbance may be a temporary loss of supply voltage, a supply over voltage surge, or an ESD event.

Power consumption reduction is another advantage of refreshing the plurality of static latches 72 via the Refresh Clock signal. In the present embodiment of the invention, the power consumed by pseudo-static mask option register 50 is a function of the sensing operation performed by the plurality of sense amplifier/programming circuits 70. Therefore, the power consumed is directly proportional to a refresh rate chosen. The refresh rate will depend upon the operational requirements of data processing system 40. In other words, the refresh rate is selected by determining that if the data in the plurality of static latches 72 is suddenly corrupted, how long could data processing system 40 continue to operate properly. The effect of the corrupted data is especially significant to each of the plurality of peripheral devices 46, 52, and 54 controlled by the one of the Enable A, Enable B, and Enable C signals.

The Reset, No Clock and Divided System Clock input signals may each be used to initiate a refresh operation. The Reset signal is the microcontroller system reset signal and is included because the Reset signal is asserted when data processing system 40 is first powered up. The No Clock signal is an indicator provided by CPU 42 or another one of the components of data processing system 40 which indicates that the System Clock signal will no longer be available. Therefore, when the No Clock signal is asserted, the refresh operation may be performed continuously on all or some bits of pseudo-static mask option register 50. The Divided System Clock signal is equal to the System Clock signal divided by a preselected integer number which defines the refresh rate of pseudo-static mask option register 50. Again, the refresh rate will vary from system to system depending on the peripheral circuits which the pseudo-static mask option register outputs (Enable A, Enable B, and Enable C) are controlling.

Information bus 58 is also bidirectionally connected to refresh circuit 60. Specifically, Information bus 58 couples CPU 42 and pseudo-static mask option register 50. The connection between CPU 42 and pseudo-static mask option register 50 allows each of the plurality of EPROM bits 64, 66, and 68 to be programmed and an output of each of the plurality of EPROM bits 64, 66, and 68 to be tested.

Each of the plurality of EPROM bits 64, 66, and 68 in pseudo-static mask option register 50 are programmed and erased in the same manner in which EPROM bits (if so implemented) would be programmed and erased in non-volatile memory 48.

A method by which the outputs of each of the plurality of EPROM bits 64, 66, and 68 is subsequently sensed and latched is illustrated in more detail in FIG. 8. Due to the interaction of each of the plurality of sense amplifier/programming circuits 70 and each of the plurality of static latches 72, only one output state of pseudo-static mask option register 50 is vulnerable to corruption during an electrical disturbance. Therefore, if data processing system 10 cannot tolerate the loss of mask option register data for any length of time, the one output state which is vulnerable, the non-volatile MOR state, should be defined to enable or disable a portion of data processing system 40 which would be adversely affected by a loss of the mask option register data.

Generation of the non-volatile MOR state is illustrated in more detail in FIG. 8. The non-volatile MOR state is accomplished by adding a feedback transistor 82 into a sensing circuit of EPROM bit 64. Transistor 78, an EPROM transistor, conducts voltage if erased and does not conduct voltage if programmed. In the embodiment of the invention described herein, transistors 80 and 82 are both p-channel enhancement mode MOSFET's. It should be noted that transistor 80 is a weak transistor which functions as a current source. Additionally, transistor 82 performs a latching function. When transistor 78 is programmed, the non-conducting EPROM bit 64 does not prevent node A from being driven to the +V or a logic high state when the Refresh signal is asserted at a gate of transistor 80. When node A is forced to high logic value, Node B is forced to a low logic value which turns transistor 82 on to hold the logic high state on Node A. After transistor 82 drives a logic one onto node A, transistor 80 turns off and a logical state of the Enable A output signal may be maintained. When transistor 78 is erased it will always drive node A to a logic low state even when transistor 80 is powered on. Therefore, the Enable A signal has a logic low state. This is the non-volatile MOR state since the state does not rely on the feedback device to hold the logical state of node A. Although only EPROM bit 64 is described in FIG. 8, EPROM bits 66 and 68 are implemented in a similar manner.

Figure 7:
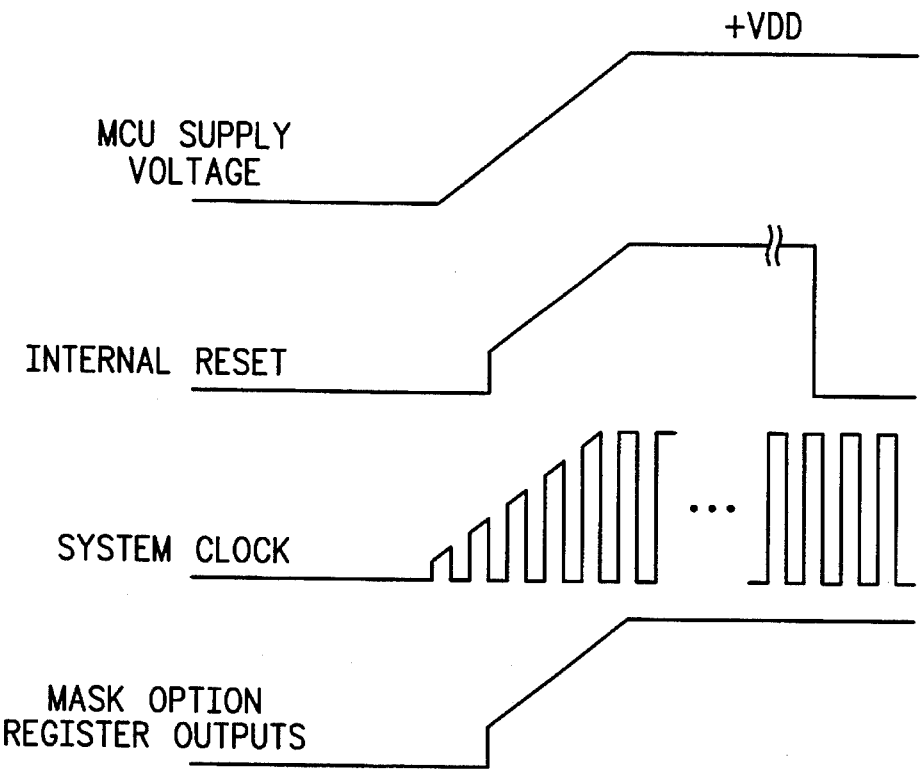
FIG. 7 illustrates in timing diagram form generation of a plurality of outputs of the pseudo-static mask option register of FIG. 5.

FIG. 7 illustrates the timing of a sample MOR output signal when power is first provided to data processing system 40. As with the continuous refresh design (illustrated in FIG. 3), the MOR output signal is valid as soon as the supply voltage is at a sufficient level for CMOS logic and EPROM bits to operate. Once the supply voltage has risen to a sufficient level, the Reset signal generated by data processing system 40 should be asserted or the Divided System Clock should begin to run. Assertion of either the Reset signal or the Divided System Clock signal will result in a first refresh operation and the MOR output signal will be driven to an appropriate state. Therefore, pseudo-static mask option register 50 is able to emulate mask option functions which are required to operate during power up and power down of data processing system 40.

Summary of the Pseudo-static Mask Option Register

A design of pseudo-static mask option register 50 combines features of both the continuous refresh and the static latched mask option register designs. First, in pseudo-static mask option register 50, the MOR function was removed from the main user memory for greater flexibility. In prior art designs, the mask option register's functionality is limited by the electrical characteristics of the main user memory and the availability of accessing the EPROM bit data. When using pseudo-static mask option register 50, the EPROM bit states may be read at any time and the needs of the main user memory do not need to be accounted for.

Second, data is not permanently lost when an electrical disturbance occurs. The refresh rate is implemented to conserve power since the read operation of the EPROM bit of pseudo-static mask option register 50 is current intensive. The refresh rate should be chosen to be as slow as data processing system 40 can tolerate.

Third, a non-volatile MOR output state is provided to allow emulation of mask options which are vulnerable to electrical disturbances. Some of the functions that the MOR outputs control cannot be disrupted for the refresh cycle time at any time.

Fourth, outputs from pseudo-static mask option register are available during system power-up and power-down to accommodate features of data processing system 40 which need to operate during this time.

The implementation of the invention described herein is provided by way of example only. However, many other implementations may exist for executing the function described herein. For example, although most of the description of pseudo-static mask option register 50 above referred to the use of EPROM bits to store the mask option register data, other forms of non-volatile memory will also suffice. EEPROM, Flash EEPROM or Ferro Magnetic memories are some of the other technologies that would also work. The sensing logic (64) required for each of these memories may vary between the various technologies, but the results will be the same. A method for sensing may also vary within each of the various technologies. Furthermore, the type of memory used to store a user's software program can also be different from the type of memory used to implement pseudo-static mask option register 50. Only the capabilities of the processing technology may limit the type of memory used. In other words, pseudo-static mask option register 50 could be implemented in an EPROM and the main memory could be ROM or EEPROM.

Additionally, the refresh rate of mask option register 50 was referred to several times without mention of a duty cycle of the Refresh clock. In order to further reduce power, the duty cycle (the ratio of the active state of the clock to total clock cycle times) can be made very small. Again, the only restriction on the duty cycle of the Refresh clock is that it be long enough to provide ample time to read the state of the EPROM bit.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A data processing system, comprising:
    an interface means for providing a mask option program value;
    input means for providing a reset signal;
    a system clock circuit for generating a system clock signal;
    a first peripheral device for executing a first predetermined data processing function in response to a first enable signal; and
    a main memory for storing a plurality of main memory values;
    a mask option register having a first input coupled to the interface means for receiving the mask option program value, a second input coupled to the system clock circuit for receiving the system clock signal, and an output for providing the first enable signal, the mask option register, comprising:
        logic means for generating a refresh signal in response to the system clock signal and the reset signal;
        a plurality of programmable memory bits for collectively storing the mask option program value, each of the plurality of memory bits providing a bit of the mask option program value;
        a plurality of sense amplifier circuits coupled to the plurality of memory bits for sensing a logic value of the mask option program value collectively provided by the plurality of memory bits in response to the refresh signal; and
        a plurality of static latches for collectively storing the mask option program value, the plurality of static latches being periodically refreshed in response to the refresh signal, a first one of the plurality of static latches providing the first enable signal.

2. The data processing system of claim 1 wherein the input means comprises a first integrated circuit pin for providing a reset signal.

3. The data processing system of claim 2 further comprising:
    a central processing unit for providing a no clock signal to indicate the system clock signal will not be generated by the system clock circuit,
    wherein the logic means logically combines each of the system clock signal, the reset signal, and the no clock signal to provide the refresh signal.

4. The data processing system of claim 1 further comprising:
    a second peripheral device for executing a second predetermined data processing function in response to a second enable signal.

5. The data processing system of claim 4 wherein a second one of the plurality of static latches provides the second enable signal.

6. The data processing system of claim 1 wherein the plurality of memory bits are implemented as a non-volatile memory.

7. The data processing system of claim 1 wherein the plurality of memory bits are an electrically programmable read only memory (EPROM).

8. The data processing system of claim 1 wherein the main memory and the plurality of memory bits comprising the mask option register are physically separate.

9. The data processing system of claim 1 wherein the main memory and the plurality of memory bits are a same type of non-volatile memory.

10. The data processing system of claim 1 wherein the main memory is implemented as a first type of non-volatile memory and the plurality of memory bits are implemented as a second type of non-volatile memory.

11. A method for mask option operation, comprising the steps of:
    receiving a mask option program value;
    receiving a system clock signal;
    providing the system clock signal to a refresh circuit, the refresh circuit generating a refresh clock signal in response to the system clock signal;
    storing the mask option program value in a plurality of memory bits, each of the plurality of memory bits storing a bit of the mask option program value;
    providing each of the plurality of memory bits to a plurality of sense amplifiers, each of the plurality of sense amplifiers sensing a logic value of a respective one of the plurality of memory bits in response to the refresh signal;
    coupling a plurality of static latches to the plurality of sense amplifiers;
    enabling the plurality of static latches to latch plurality of logic values corresponding to the plurality of memory bits; and
    periodically refreshing the plurality of static latches to maintain the plurality of logic values stored therein in response to the refresh signal.

12. The method of claim 11 wherein a first one of the plurality of static latches provides a first enable signal, the first enable signal being used to enable a peripheral device to perform a first data processing function.

13. The method of claim 12 further comprising the steps of:
    providing a reset signal;
    providing a clock absent signal; and
    logically combining each of the system clock signal, the reset signal, and the clock absent signal to provide the refresh signal.

14. The method of claim 11 wherein the plurality of memory bits are implemented as a non-volatile memory.

15. The method of claim 11 wherein the plurality of memory bits are an electrically programmable read only memory (EPROM).

16. A data processing system, comprising:
    a central processing unit for processing a plurality of data processing functions, the central processing unit providing a mask option program value;
    a system clock circuit for generating a system clock signal;
    a first peripheral device for executing a first predetermined data processing function in response to a first enable signal; and a main memory for storing a plurality of main memory values;

a mask option register having a first input coupled to the central processing unit for receiving the mask option program value, a second input coupled to the system clock circuit for receiving the system clock signal, and an output for providing the enable signal, the mask option register, comprising:

logic means for generating a refresh signal in response to the system clock signal;

a first transistor having a fist terminal coupled to a first voltage value, a second terminal coupled to a reference voltage value, and a third terminal;

a current source circuit having an output coupled to the third terminal of the first transistor, a first input coupled to the logical means for receiving the refresh signal, and a second input coupled to the first voltage value;

a current sensor circuit having an input coupled to the third terminal of the first transistor, the current sensor circuit having an output for indicating when the first transistor conducts current;

a latching means having an input coupled to the output of the current sensor circuit, the latching means maintaining a logic value of the output of the current sensor circuit, the latching means having an output; and a buffer having an input coupled to the output of the current sensor circuit for providing the first enable signal.

17. The data processing system of claim 16 further comprising:

a first integrated circuit pin for providing a reset signal.

18. The data processing system of claim 17 wherein the logic means logically combines each of the system clock signal, the reset signal, and a clock absent signal to provide the refresh signal.

19. The data processing system of claim 16 further comprising:

a second peripheral device for executing a second predetermined data processing function in response to a second enable signal.

20. The data processing system of claim 16 wherein the plurality of memory bits are implemented as a non-volatile memory.

21. The data processing system of claim 16 wherein the main memory and the plurality of memory bits comprising the mask option register are physically separate.

22. A mask option register, comprising:

input means for receiving a plurality of control signals;

logic means for logically combining the plurality of control signals to provide a refresh clock signal, the logic means being coupled to the input means for receiving the plurality of control signals;

a plurality of programmable memory bits for communicating a mask option program value;

a plurality of sense amplifiers coupled to the logic means for receiving the refresh clock signal and coupled to the plurality of programmable memory bits for communicating the mask option program value, the plurality of sense amplifiers sensing the mask option program value; and a plurality of static latches for selectively storing the mask option program value, each of the plurality of static latches being periodically refreshed in response to the refresh clock signal.

23. The mask option register of claim 22 wherein the plurality of programmable memory bits are implemented as an electrically programmable read only memory.

24. The mask option register of claim 22 wherein the plurality of control signals includes a reset signal, a system clock signal, and a clock absence signal.

25. The mask option register of claim 24 wherein the clock absence signal is provided to indicate the system clock signal will not be generated.

* * * * *